United States Patent [19]
Kondo

[11] Patent Number: 5,254,490
[45] Date of Patent: Oct. 19, 1993

[54] SELF-ALIGNED METHOD OF FABRICATING AN LDD MOSFET DEVICE

[75] Inventor: Toshihiko Kondo, Suwa, Japan

[73] Assignee: Seiko Epson Corporation, Tokyo, Japan

[21] Appl. No.: 825,448

[22] Filed: Jan. 22, 1992

Related U.S. Application Data

[62] Division of Ser. No. 636,660, Jan. 2, 1991, abandoned.

[30] Foreign Application Priority Data

| Jan. 11, 1990 | [JP] | Japan | 2-4188 |
| Jan. 11, 1990 | [JP] | Japan | 2-4190 |
| Oct. 2, 1990 | [JP] | Japan | 2-265895 |

[51] Int. Cl.$^5$ ............................ H01L 21/336
[52] U.S. Cl. .................... 437/44; 437/193; 437/200
[58] Field of Search .............. 357/23.3, 71; 437/189, 437/193, 200, 44, 41; 257/344, 408, 413

[56] References Cited

U.S. PATENT DOCUMENTS

| 4,521,448 | 6/1985 | Sasaki | 357/23.3 |
| 4,727,038 | 2/1988 | Watabe et al. | 357/23.3 |
| 4,804,636 | 2/1989 | Groover, III et al. | 437/52 |
| 4,868,617 | 1/1989 | Chiao et al. | 357/23.3 |
| 4,925,807 | 5/1990 | Yoshikawa | 357/23.3 |
| 4,971,922 | 11/1990 | Watabe et al. | 357/23.3 |

FOREIGN PATENT DOCUMENTS

| 61-202467 | 9/1986 | Japan | 357/23.3 |
| 63-44768 | 2/1988 | Japan | 357/23.3 |
| 63-44770 | 2/1988 | Japan | 357/23.3 |
| 63-122174 | 5/1988 | Japan | 357/23.3 |
| 63-144574 | 6/1988 | Japan | 357/23.3 |
| 1-25475 | 1/1989 | Japan | 357/23.3 |

OTHER PUBLICATIONS

Izawa, R., "Impact of Gate-Drain Overlapped LDD (Gold) for Deep Submicron VLSI's", IEDM 87, 1987, pp. 38–41.

Huang, T. et al., "A Novel Submicron LDD Transistor with Inverse-T Gate Structure", IEDM 86, 1986, pp. 742–745.

Primary Examiner—T. N. Quach
Attorney, Agent, or Firm—Harold T. Tsiang

[57] ABSTRACT

A production method for an MIS device comprises forming an insulator layer on a semiconductor substrate, depositing a gate electrode having a conductive silicon layer on part of the insulator layer, forming a low-concentration area on part of the surface of the semiconductor substrate using the gate electrode as a mask in a self-aligned manner, depositing a refractory metal layer on the surface of both the gate electrode and insulating film, using a heat treatment process to change part of refractory metal layer which is in contact with gate electrode into a silicide and part of the refractory metal layer which is in contact with the insulator layer into a nitride layer, removing the refractory metal layer leaving that part above surface of gate electrode and a sidewall part a prescribed thickness on the sides of the gate electrode, and forming the source and drain areas on the surface of semiconductor substrate using both the gate electrode and sidewall as a mask. In an alternative method, electrode contact holes are formed in the insulator layer prior to forming the refractory metal layer. The portion of the refractory metal layer above the electrode contact holes is made into a silicide in a heat treatment process. The silicide layer is selectively left behind by the process which removes only the refractory metal.

7 Claims, 3 Drawing Sheets

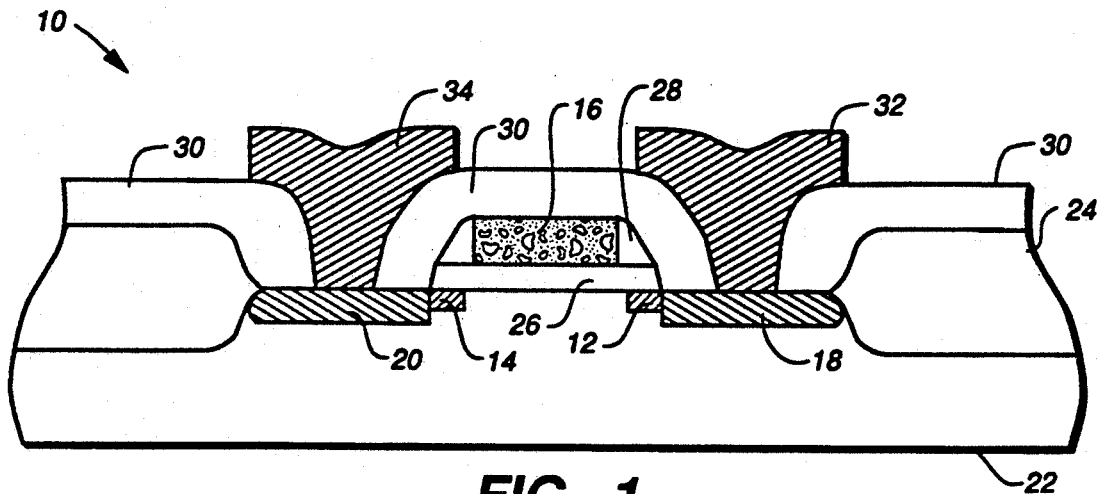
FIG._1
(PRIOR ART)
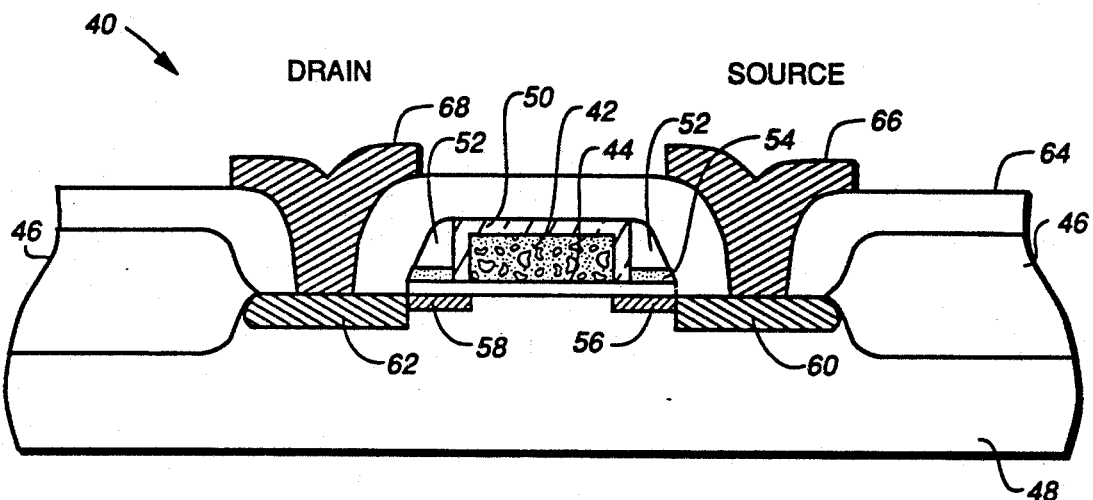
FIG._2
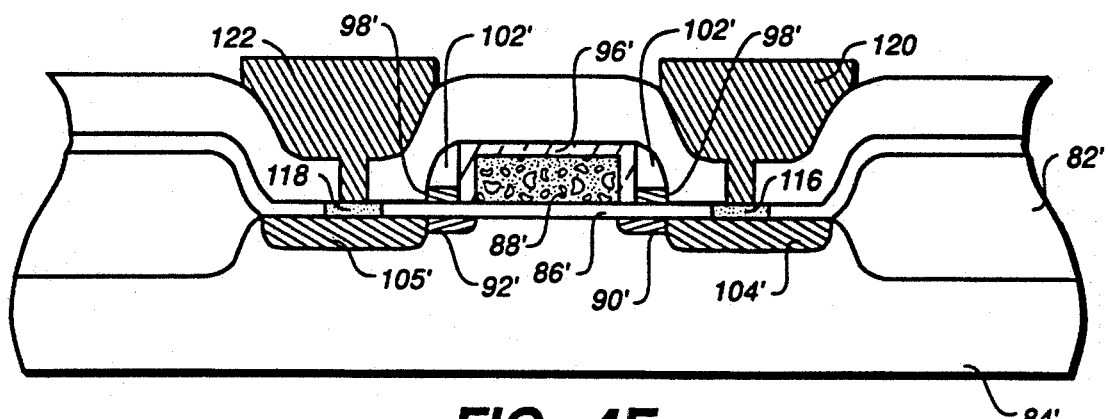
FIG._4E

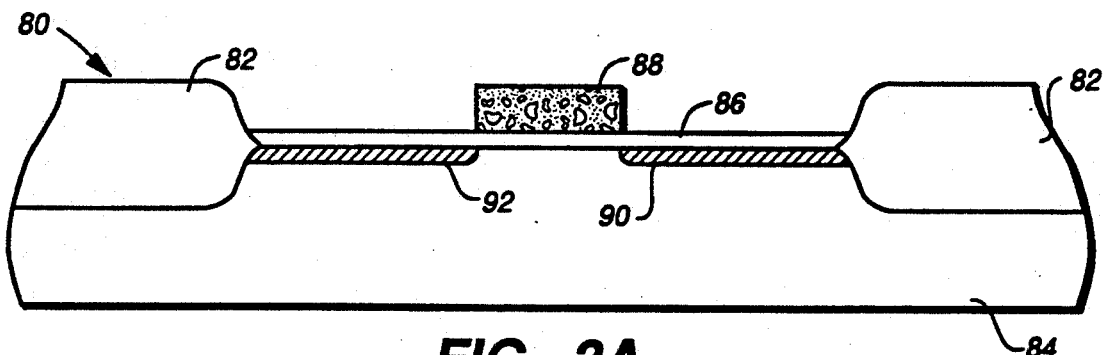
FIG._3A
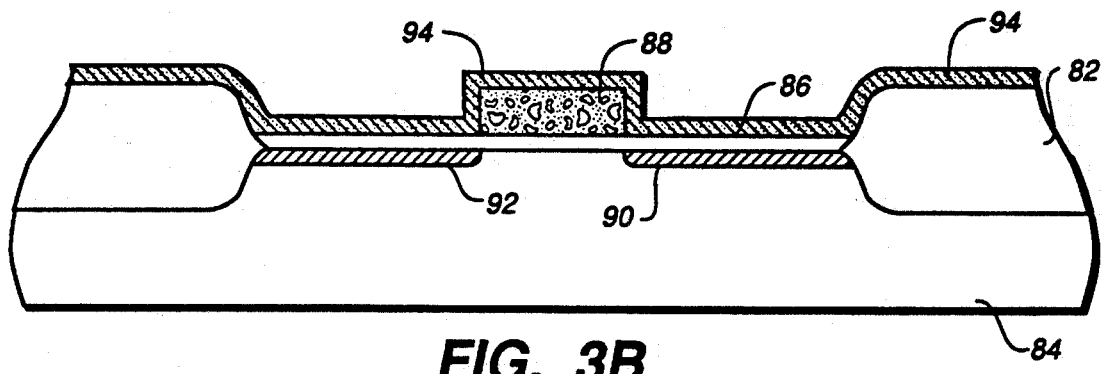
FIG._3B
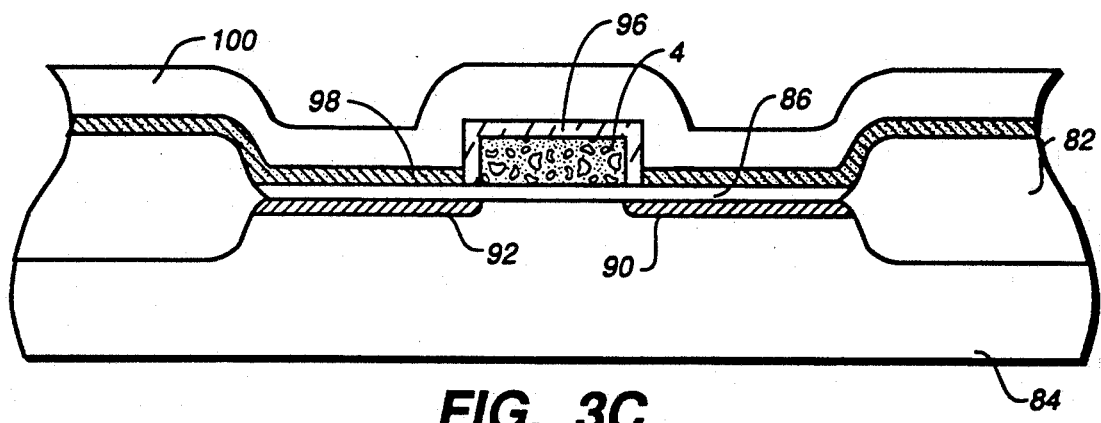
FIG._3C
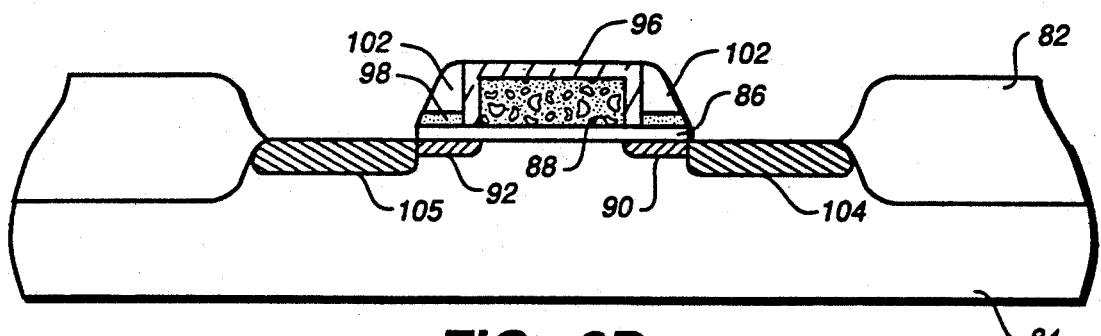
FIG._3D

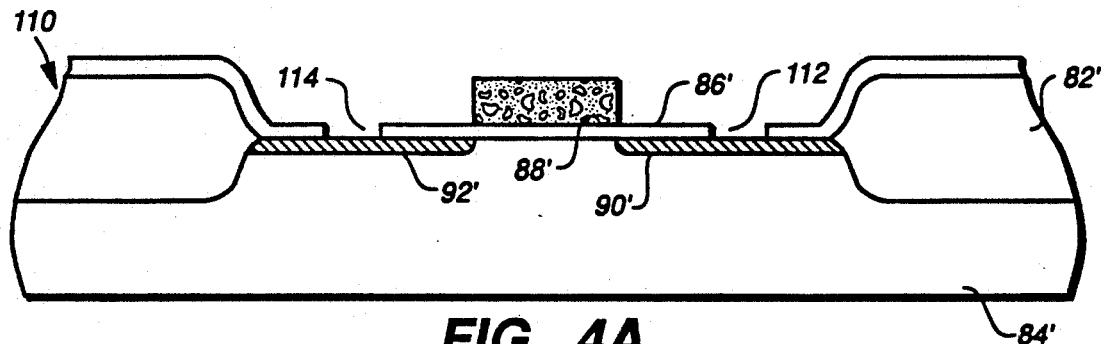
FIG._4A
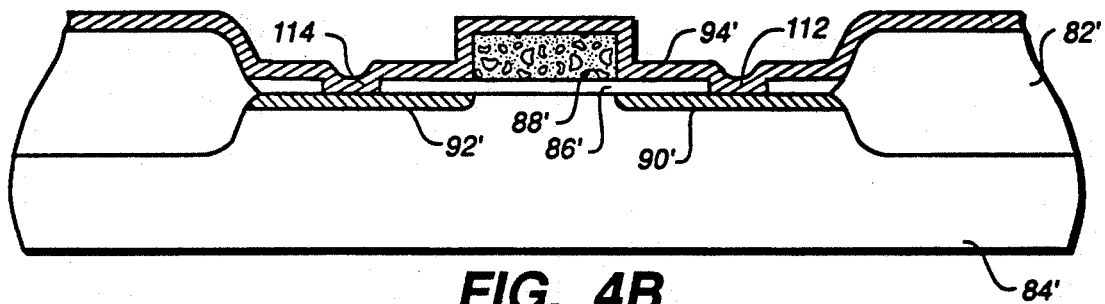
FIG._4B
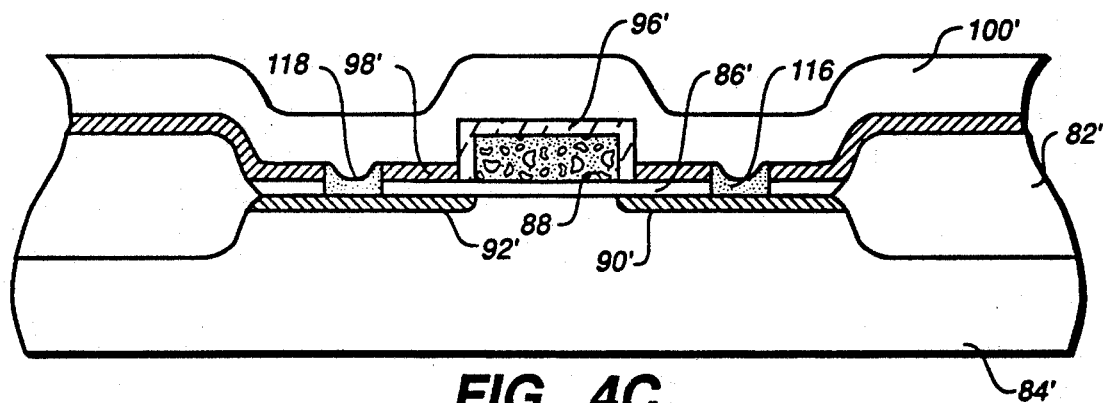
FIG._4C
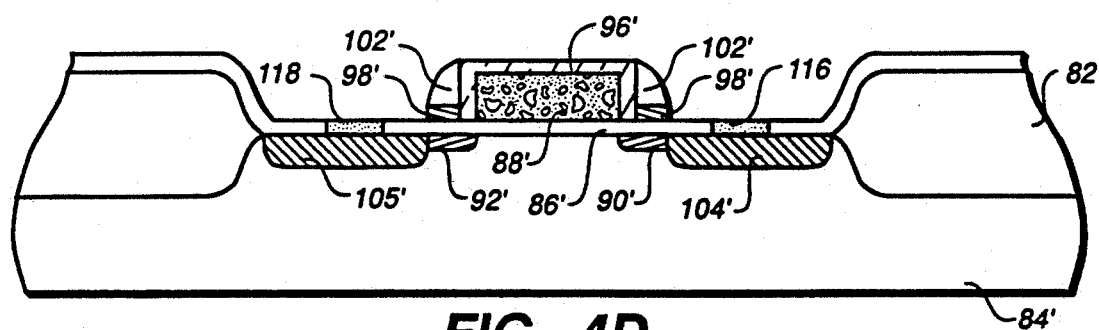
FIG._4D

SELF-ALIGNED METHOD OF FABRICATING AN LDD MOSFET DEVICE

This is a divisional of copending application Ser. No. 07/636,660 filed Jan. 2, 1991 abandoned.

BACKGROUND OF THE INVENTION

This invention relates generally to metal-insulator-semiconductor (MIS) devices and production methods and more particularly to a self-aligned method of fabricating MIS semiconductor devices having lightly doped-drain (LDD) structures and inverse-T gate structures.

As the microminiaturization of metal-oxide-semiconductor (MOS) transistors progresses, two different effects become a problem due to the short-channel limitations, these are the punch-through and hot-carrier injection effects. For a bipolar transistor with a very narrow base width or a base with relatively low doping, a breakdown may be caused by the punch-through effect, in which the neutral base width is reduced to zero at a sufficient $V_{cb}$ and the collector depletion region is in direct contact with the emitter depletion region. In a MOS transistor, a concentration of the electric field at the end of the drain causes hot carriers to be captured mainly at the interface between the substrate and the insulator film or in the insulator film. The operating characteristics of such MOS transistors can drift, due to an accumulation of the electric charge.

FIG. 1 illustrates a prior art attempt in an LDD structure 10 to prevent the above concentration of an electric field at the end of the drain. Structure 10 has a pair of lower-carrier concentration areas 12 and 14 on a gate electrode 16 side of a source area 18 and a drain area 20, and are formed on the surface of a p-type silicon substrate 22 on either side of gate electrode 16. In fabricating structure 10, LOCOS isolation is used to produce self-aligned implants to a field oxide. (See, Rabbat, G., *Handbook of Advanced Semiconductor Technology and Computer Systems*, (Van Nostrand Reinhold Co.: New York) 1988, pp. 233-235 [LOCOS isolation process steps].) The LOCOS isolation produces an oxide film 24 formed on substrate 22 that surrounds a self-aligned active transistor area. Over this active area is deposited a gate oxide film 26. Polysilicon is then deposited on top of this to form gate electrode 16. Low-concentration areas 12 and 14 are formed by introducing phosphorous to the surface of silicon substrate 22 by ion implantation, and by using gate electrode 16 as a mask. An oxide film is then deposited over both gate electrode 16 and gate insulator film 26. The oxide film is etched afterwards, leaving a sidewall insulator film 28. Source area 18 and drain area 20 are formed by a self-aligned ion implantation of arsenic, using gate electrode 16 and sidewall insulator film 28 as a mask. An oxide film 30, a source electrode 32, and a drain electrode 34 complete the fabrication of structure 10. Low-concentration areas 12 and 14 suppress widening of the depletion layer and prevent punch-through between source area 18 and drain area 20, they also reduce electric field concentration at end of the drain and thereby suppresses deterioration of MOS transistor characteristics due to hot carrier injection phenomenon.

In recent years, however, demand for greater integration of semiconductor devices has brought about a need for further microminiaturization of MOS transistors. In very small MOS transistors with LDD structures, an electric field accumulates at the ends of their drains and an injection of an electric charge into sidewall insulator film 28 occurs. As was happening in normal MOS transistors, a depletion layer forms around low-concentration areas 12 and 14. This increases the resistance of areas 12 and 14, and that reduces the current carrying capacity of the transistor.

To solve this problem, a method evolved that extends gate electrode 16 to the areas above the low-concentration areas 12 and 14. Thus creating an inverted-T gate structure. An electric field from the gate potential is impressed on the surface of low-concentration areas 12 and 14, such that the electric field strength is weakened in the planar direction. The injection of hot carriers is thereby suppressed.

However, since etching is used to form the inverted-T gate, it is difficult to control the thickness of the thinner parts of the inverted-T. It is also difficult to set the carrier density or the depth of the low-concentration areas 12 and 14, because areas 12 and 14 are formed through these thinnest parts. This results in wide production deviations in the characteristics of the MOS transistor yield.

In the present invention, the inverted-T gate structure is formed after the formation of low-concentration areas, so the impurity concentration or depth of low-concentration areas can be easily controlled and variation in characteristics between production units reduced. Even if the low-concentration areas are formed after temporarily forming a titanium layer or nitride layer, the thickness of titanium layer formed by sputtering can be set precisely, so impurity concentration and depth of low-concentration areas can be obtained with some degree of accuracy.

In the inverted-T polysilicon gates of prior art, time control of amount of etching and precise process control of the formation of a natural oxide layer were required. But these became extremely difficult as microminiaturization of the devices progressed. Deviations in element characteristics and decreased yield resulted. In contrast, a process of the present invention is capable of forming an inverted-T gate structure extremely simply and accurately by forming a titanium layer. It can also accurately build an inverse T-structure without being greatly affected by microminiaturization.

The present invention solves the above problems, and yields a small MOS transistor having a practical production method that suppresses punch-through and hot carrier injection without degrading the operating characteristics.

SUMMARY OF INVENTION

According to the present invention, an MIS device comprises an insulating film formed on the surface of a semiconductor substrate, a gate electrode comprising a conductive silicon layer in a prescribed area on the insulating film, and a source and drain area formed on the surface of semiconductor substrate below and outside edges of gate electrode. A pair of low-concentration areas, formed on ends of the source area and drain areas toward the gate electrode, have a carrier concentration that is lower than that of the source and drain areas with which they are in contact. In applications in which a high melting-point (refractory) metal layer has been deposited on the gate and insulating film, a part of the refractory metal layer which is in contact with the gate electrode comprises a silicide. A part of the refractory metal layer on the insulator layer may also comprise a nitride.

A production method for the above MIS device comprises forming an insulator layer on a semiconductor substrate, depositing a gate electrode having a conductive silicon layer on part of the insulator layer, forming a low-concentration area on part of the surface of the semiconductor substrate using the gate electrode as a mask in a self-aligned manner, depositing a refractory metal layer on the surface of both the gate electrode and insulating film, using a heat treatment process to change part of refractory metal layer which is in contact with gate electrode into a silicide, removing the refractory metal layer leaving that part above surface of gate electrode and a sidewall part a prescribed thickness on the sides of the gate electrode, and forming the source and drain areas on the surface of semiconductor substrate using both the gate electrode and sidewall as a mask. In an alternative method, electrode contact holes are formed in the insulator layer prior to forming the refractory metal layer. The portion of the refractory metal layer above the electrode contact holes is made into a silicide in a heat treatment process. The silicide layer is selectively left behind by the process which removes only the refractory metal.

An advantage of the present invention is that the inverted-T gate structure is formed from a refractory metal layer or its nitride layer such that it is contiguous with the silicide layer and such that it is in conductive contact with the gate electrode. A uniform electric field (based on the gate potential) is applied to the entire surface area of the low-concentration areas. A concentration of an electric field at the end of drain due to microminiaturization of element is alleviated, and any hot carrier injection effect is quashed. Deterioration of key MIS transistor characteristics, due to accumulation of electric change, is avoided and such a device can be stabilized so as to offer a longer service life.

A further advantage of the present invention is that the contact surface area between gate electrode and refractory metal layer is larger than in the polycide wiring of the prior art. Therefore the contact resistance is reduced and low-resistance gate wiring can be used to advantage. As a direct consequence, the MIS semiconductor device operates faster than the prior art.

A further advantage of the present invention is that gate electrodes can be formed accurately and in minute detail due to the excellent control afforded by the process. Because the low-concentration areas are not formed by ion implantation through thin parts of the inverted-T gate, it is much easier to optimize the operation characteristics of MIS semiconductor device and achieve uniform characteristics. Since the refractory metal layer is formed after the low-concentration areas, the low-concentration areas can be formed precisely without effecting film thickness of refractory metal layer. And also since the shape of the refractory metal layer at time of its formation is used as is, the inverted-T gate structure can be formed precisely.

A further advantage of the present invention is that the formation of contacts by self-aligned silicide technique can be performed simultaneously, by using refractory metal silicide layer as contacts for the source and drain electrodes, and the inverted-T gate structure.

A further advantage of the present invention is that when holes for electrode contact are first formed in the insulator layer and a refractory metal layer is formed on insulating film and heat treated, that part of refractory metal layer above holes for electrode contact becomes a silicide layer in addition to that part in contact with gate electrode. Following this, by leaving a silicide layer behind in a process that removes the refractory metal, sidewall parts are formed on the sides of gate electrode. The layer can then be used as a contact and barrier layer. Prior art silicide technology can be used in the formation of the inverted-T gate structure.

These and other objects and advantages of the present invention will no doubt become obvious to those of ordinary skill in the art after having read the following detailed description of the preferred embodiments which are illustrated in the various drawing figures.

BRIEF DESCRIPTION OF DRAWINGS

FIG. 1 is a cross section of a prior art MOSFET having an LDD structure;

FIG. 2 is a cross section of an MIS semiconductor device of the present invention;

FIGS. 3A–3D are cross sections of the MIS semiconductor device showing the steps of the production method; and FIGS. 4A–4E are cross sections showing an alternative embodiment of the production method.

DESCRIPTION OF PREFERRED EMBODIMENTS

First Embodiment—FIG. 2 is a cross-sectional view showing the structure of an LDD MOSFET device 40 of the present invention. A gate electrode 42 and gate insulating film 44 of polysilicon are formed on an area surrounded by a LOCOS isolation process oxide film 46 that is grown on the surface of a p-type silicon substrate 48. Gate electrode 42 is covered on its top and sides with a silicide layer 50 and made from titanium. A sidewall insulating film 52, which is preferably 0.3 to 1.0 microns thick, is formed on the sides of gate electrode 42 and covers a titanium nitride layer 54 that is contiguous with silicide layer 50. Titanium nitride layer 54 separates sidewall insulating film 52 from gate insulating film 44. A pair of n-type low-concentration areas 56 and 58 have a doping of approximately $1 \times 10^{13}/cm^2$. Areas 56 and 58 are formed under and toward the edges of gate electrode 42. An n+ type source area 60 and drain area 62 are formed under and outside the perimeters of sidewall insulating film 52 and nitride layer 54, such that areas 60 and 62 are in contact with low-concentration areas 56 and 58, respectively. An interlayer insulating film 64, a source electrode 66, and a drain electrode 68 complete device 40. Gate electrode 42 is in electrical contact with silicide layer 50 by virtue of a stable conductive contact area between them. Silicide layer 50 and nitride layer 54 are formed such that they are contiguous with one another. The potentials of gate electrode 42, silicide layer 50, and nitride layer 54 will all therefore track the potential on gate electrode 42. Low-concentration areas 56 and 58 are formed below the edges of gate electrode 42 and are positioned opposite to nitride layer 54 (with gate insulating film 44 between them). Unlike prior art LDD structured MOSFETs, the entire surfaces of the low-concentration areas 56 and 58 are under the influence of a uniform gate potential throughout the gate insulating film 44. The potential gradient between the source and drain is thereby flattened and a concentration of the electric field at the end of the drain (caused by microminiaturization) is avoided. Hot electron injection accumulation of an electric charge in the end region of the drain is prevented, and this stabilizes the operating characteristics and lengthens the life of device 40. These benefits can be realized without affecting, e.g., the transconductance of device 40. The prior art uses polycide wiring to form a refractory metal silicide on gate electrodes. But in the gate structure of this embodiment, the contact area between gate electrode 42 and silicide layer 50 is larger than that of the polycide wiring, so the resistance of the gate wiring can be further reduced. Silicide layer 50 provides a stable conductive contact with gate electrode 42. A refractory metal other than titanium, such as molybdenum, can be used.

Second Embodiment—A production method for a device 80, which is similar to the first embodiment, is described below. As shown in FIG. 3A, a LOCOS oxide film 82 is formed on the surface of a p-type silicon substrate 84 by a selective oxidation method. A gate oxide film 86, which is 100 Å to 500 Å thick, is formed on the surface of an area that is enclosed by LOCOS oxide film 82. Polysilicon is built up on gate insulating film 86 by a thermal chemical vapor deposition (CVD) method to form a gate electrode 88 which is 4000 to 5000 Å thick. Dry etching is used to shape gate electrode 88. Using gate electrode 88 as a mask, phosphorous is introduced to the surface of silicon substrate 84 by ion implantation to form a pair of n- type low-concentration areas 90 and 92. FIG. 3B illustrates a titanium layer 94 covering the surface of silicon substrate 84 that is sputtered to a thickness of 300 Å to 1000 Å. Silicon substrate 84 is then heated to a temperature of 600° C. to 800° C., in a nitrogen atmosphere, for 20 to 60 minutes. FIG. 3C shows that a part of the titanium layer 94 which was in contact with the top and sides of gate electrode 88 changes into a silicide layer 96 by virtue of a chemical reaction between the polysilicon of gate electrode 88 and the titanium in layer 94. The titanium layer 94 above gate oxide film 86 hardly reacts with silicon at all (because the silicon dioxide of oxide film 86 acts as a chemical barrier to the silicon substrate 84). Instead, the titanium takes nitrogen from the heat treatment atmosphere and transforms itself into a nitride layer 98. Following this, an oxide film 100 is grown by thermal CVD and then is removed by reactive ion etching (RIE). This forms a sidewall insulating film 102 on the sides of gate electrode 88 as shown in FIG. 3D. Unwanted parts of nitride layer 98 and oxide film 100 are then removed by etching. By using an etching gas that has fluorine, both the nitride layer 98 and oxide film 100 are removed in one process step. Gate electrode 88 and its sidewall insulating film 102 are then used as a mask to implant n+ type source area 104 and drain area 105 by self-aligned arsenic ion implantation in the exposed surfaces of silicon substrate 84. The result is that the gate of the transistor thus formed overlaps the source and drain, and is self-aligned. Since the titanium layer 94 is formed on the surface of gate electrode 88 by sputtering or CVD, the film thickness of titanium layer 94, and ultimately layer 98, can be tightly controlled. When titanium layer 94 is silicided, a stable, highly conductive contact between gate electrode 88 and silicide layer 96 is made. Alternatively to forming silicide layer 96 and nitride layer 98 by heat treatment of the titanium layer 94 in a nitrogen atmosphere, other inert gases can also be used. Heat treatment in a hydrogen atmosphere is also possible, in which case titanium layer 94 will not be nitrided, rather it will remain in its original metal state. Since a conductive contact with gate electrode 88 is achieved with silicide layer 96, a similar conductive contact is made with the titanium. A non-nitrided titanium layer 98 has an advantage over a nitrided layer 98 in that non-nitrided titanium is more highly conductive.

Third Embodiment—FIG. 4 shows an alternative production method for an MIS device 110. Elements similar to those described above are indicated by using the above element numbers with prime notation. FIG. 4A shows a pair of contact holes 112 and 114 are opened up in gate oxide film 86' after the forming of low-concentration areas 90' and 92'. In FIG. 4B, titanium layer 94' is shown after being deposited on top. Titanium layer 94' is heat treated in same manner as in second embodiment above. In FIG. 4C, the titanium in layer 94' which is in contact holes 112 and 114 becomes silicided due to silicon diffusing up from the surface of silicon substrate 84'. This forms silicide plugs 116 and 118, respectively. Following this, as shown in FIG. 4D, oxide layer 100' and much of layer 98' are removed by dry etching to leave behind sidewall insulating film 102'. The unreacted (non-nitrided and non-silicided) parts of the titanium layer 94' are removed by selective etching. The bottoms of silicide plugs 116 and 118 also remain. Arsenic ion implantation (with oxide film 86' as a screen oxide) is used to implant source area 104' and drain area 105'. Next, as shown in FIG. 4E, source electrode 120 and drain electrode 122 are formed on top of silicide layers 116 and 118. The contact resistance of source electrode 120 and drain electrode 122 is reduced by using refractory metal for contacts to source electrode 104' and drain electrode 105'. A reduction of electrode contact resistance by self-aligned silicide technique and the formation of inverted-T gate structure are simultaneously achieved, thus reducing number of process steps required.

While invention has been described in conjunction with several specific embodiments, it will be evident to those skilled in art that many further alternatives, modifications and variations are possible, in light of the foregoing description. Thus, the invention described herein is intended to embrace all such alternatives, modifications, applications and variations as may fall within the spirit and scope of appended claims.

What is claimed is:

1. A self-aligned method for fabricating MIS semiconductor devices, the method comprising the steps of:
   forming a first insulator layer on a semiconductor substrate;
   forming a gate electrode comprising a conductive silicon layer on part of the first insulator layer;
   forming two lightly doped areas under the surface of the semiconductor substrate;
   forming a refractory metal layer on the surface of the gate electrode and on the first insulator layer;
   heat treating the refractory metal layer to convert a part of the refractory metal layer in contact with the gate electrode into a silicide layer and a part of the refractory metal layer in contact with the first insulator layer into a nitride layer;
   forming a second insulator layer over and on the sides of the gate electrode over the semiconductor substrate;
   etching the first and second insulator layers and the nitride layer so that sidewalls of the second insulator layer are formed on the sides of the gate electrode and portions of the first insulator layer and nitride layer covered by the gate electrode and the sidewalls are left behind; and forming a source area and a drain area under the surface of the semiconductor substrate using the gate electrode and the sidewalls as a mask.

2. The method of claim 1, further comprising:

prior to forming the refractory metal layer, creating two contact holes in the first insulator layer above the source and drain areas, respectively; and wherein in the step of heat treating, portions of the refractory metal layer in the contact holes are converted into silicide layers; and wherein in the step of etching, the silicide layers in the contact holes are left behind for coupling the source and drain areas to respective electrodes.

3. A self-aligned method for fabricating an MIS device, comprising the steps of:

forming a first insulating layer on a semiconductor substrate;

forming a gate electrode comprising a conductive silicon layer on a part of the first insulating layer;

forming two lightly doped areas each on a side of the gate electrode under the surface of the semiconductor substrate using the gate electrode as a mask;

forming a refractory metal layer on the surface of the gate electrode and the first insulating layer;

heat treating the refractory metal layer in a nitrogen atmosphere to convert a part of refractory metal layer in contact with the gate electrode into a silicide layer and a part of the refractory metal layer in contact with the first insulating layer into a nitride layer;

forming a second insulating layer over and on the sides of the gate electrode over the semiconductor substrate;

etching the first and second insulating layers and the nitride layer so that sidewalls of the second insulating layer with a predetermined thickness are formed on the sides of the gate electrode and portions of the first insulating layer and nitride layer covered by the gate electrode and the sidewalls are left behind; and forming a source area and a drain area under the surface of semiconductor substrate using both the gate electrode and the sidewalls as a mask.

4. A self-aligned method for fabricating an MIS device, comprising the steps of:

forming a first insulating layer on a semiconductor substrate;

forming a gate electrode comprising polysilicon on a part of the first insulating layer;

forming two lightly doped areas each on a side of the gate electrode under the surface of the semiconductor substrate using the gate electrode as a mask;

opening up a first source contact hole and a first drain contact hole in the first insulating layer to expose the substrate;

forming a refractory metal layer on the surface of the gate electrode, in the contact holes, and on the first insulating layer;

heat treating the refractory metal layer in a nitrogen atmosphere to convert a part of the refractory metal layer in contact with the gate electrode into a silicide layer and a part of the refractory metal layer in contact with the first insulating layer into a nitride layer;

forming a second insulating layer over and on the sides of the gate electrode over the semiconductor substrate;

etching the first and second insulating layers and the nitride layer so that sidewalls of the second insulating layer with a predetermined thickness are formed on the sides of the gate electrode and portions of the first insulating layer and nitride layer covered by the gate electrode and the sidewalls are left behind;

forming a source area and a drain area on the surface of semiconductor substrate using both the gate electrode and sidewall as a mask;

forming a third insulating layer over and on the sides of the gate electrode over the substrate;

opening up second source and drain contact holes above the first source and drain contact holes, respectively; and depositing metal layers in the second source and drain contact holes in contact with the silicide layers in the first source and drain contact holes.

5. A self-aligned method of fabricating an LDD MOSFET device, comprising the steps of:

growing LOCOS oxide films on the surface of a first conductive type silicon substrate with a selective oxidation method;

forming a gate oxide film on the surface of said silicon substrate surrounded by said LOCOS oxide films;

depositing polysilicon on said gate oxide film by a thermal chemical vapor deposition (CVD) method to form a gate electrode;

implanting, using said gate electrode as a mask, phosphorous in the surface of said silicon substrate to form a pair of lightly doped second conductive type areas;

depositing a titanium layer to cover the surfaces of the gate electrode and the silicon substrate;

heating said silicon substrate in a nitrogen atmosphere such that a part of said titanium layer in contact with the top and sides of said gate electrode changes into a silicide layer, and a part of said titanium changes into a nitride layer;

growing an oxide layer by thermal CVD;

removing at least part of said oxide layer by reactive ion etching so as to form sidewall insulating films on the sides of said gate electrode;

removing parts of said nitride layer and oxide layer by etching with an etching gas comprising fluorine such that both the nitride layer and oxide layer are removed in one process step; and implanting, using gate electrode and the sidewall insulating films as a mask, an n+ type source area and drain area by self-aligned arsenic ion implantation in the exposed surfaces of silicon substrate such that the gate thus formed overlaps said source and drain.

6. The method of claim 5, wherein:

the depositing of titanium comprising depositing the titanium to a thickness in the range of 300 Å to 1000 Å.

7. The method of claim 5, wherein:

the heating is in the range of 600° C. to 800° C.

* * * * *